United States Patent [19]

Kim

[11] 4,035,830
[45] July 12, 1977

[54] COMPOSITE SEMICONDUCTOR CIRCUIT AND METHOD OF MANUFACTURE

[75] Inventor: Chung K. Kim, Lexington, Mass.

[73] Assignee: Raytheon Company, Lexington, Mass.

[21] Appl. No.: 632,324

[22] Filed: Nov. 17, 1975

Related U.S. Application Data

[62] Division of Ser. No. 465,213, April 29, 1974, abandoned.

[51] Int. Cl.² ............... H01L 23/48; H01L 39/02; H01L 23/02
[52] U.S. Cl. ............................ 357/67; 357/65; 357/71; 357/80; 357/81
[58] Field of Search ............... 357/65, 67, 68, 69, 357/71, 80, 81

[56] References Cited

U.S. PATENT DOCUMENTS

| | | | |
|---|---|---|---|
| 3,825,353 | 7/1974 | Loro | 357/68 |
| 3,893,229 | 7/1975 | Aird | 357/71 |
| 3,909,929 | 10/1975 | Debesis | 357/68 |

Primary Examiner—Edward J. Wojciechowicz

Attorney, Agent, or Firm—J. R. Inge; M. D. Bartlett; J. D. Pannone

[57] ABSTRACT

A process of forming a composite semiconductor integrated circuit by forming one or more epitaxial layers of semiconductor material on a semiconductor substrate, forming pedestals by etching partially through said epitaxial layers to form regions projecting from said substrate and etching through said epitaxial layers to form stress relieving channels in the substrate surrounding the pedestals. A thick layer of easily removable material such as an evaporated layer of chromium plus gold and a plated layer of gold is deposited of sufficient thickness to provide good mechanical support, and the substrate is removed by lapping, grinding or etching until at least the stress relieving channels are exposed thereby forming separate semiconductor elements containing said epitaxial regions. An electrical contact layer is deposited across the surface of the remaining substrate and connected to a thermally conductive support which may be either conductive, such as a block of copper, or insulating, such as a block of beryllium oxide, the support material surrounding the epitaxial regions and completing the construction of the device by forming ohmic and/or rectifying contacts to one or more layers of said epitaxial regions.

12 Claims, 7 Drawing Figures

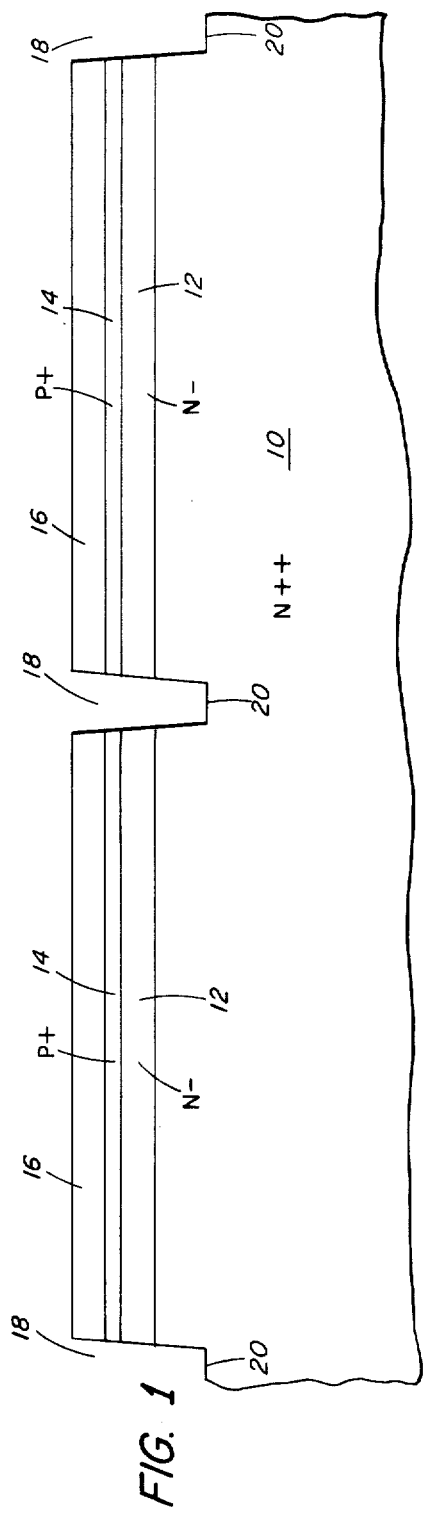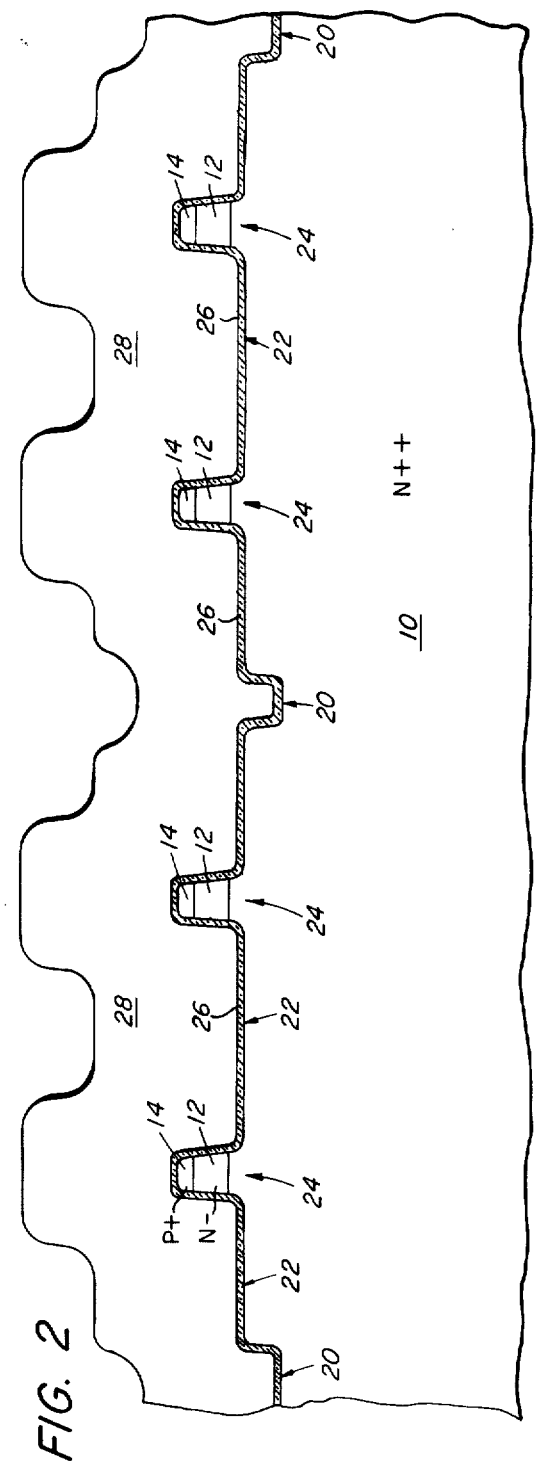

COMPOSITE SEMICONDUCTOR CIRCUIT AND METHOD OF MANUFACTURE

CROSS REFERENCE TO RELATED APPLICATIONS

This is a division of application Ser. No. 465,213, filed Apr. 29, 1974, now abandoned.

BACKGROUND OF THE INVENTION

In the formation of integrated circuits it is known that semiconductor substrates have been used to hold large numbers of individual active and/or passive semiconductor elements formed on the surface of one or more layers of semiconductor material deposited on a semiconductor substrate to form integrated circuits in which substantial uniformity of the elements occurs by reason of use of portions of the same epitaxial layer formed at the same time for all elements. Isolation between elements has been achieved by diffusion isolation with removal of portions of the semiconductor layers and back biasing junctions formed with the substrate. As larger and larger numbers of integrated circuits are spaced closer together in such constructions, heat dissipation either through the subsequently attached leads or through the semiconductor substrate severely limits permissible currents, power handling capabilities and/or the spacing of the elements since the semiconductor substrate is a relatively poor conductor of heat. In structures of the prior art, such as power transistors, it has been known to form individual semiconductor elements, individually select and test such elements and individually mount such elements on heat sinks or the like by known means using techniques shown, for example, in U.S. Pat. No. 3,058,041 issued Oct. 9, 1962 to W. W. Happ and assigned to the same assignee as this invention. Such fabrication for integrated circuits either for operation of a plurality of individual elements in parallel, in series, or as elements performing different electrical functions is, however, expensive, particularly when the size of the elements is reduced to sizes having transverse dimensions below a few hundredths of a millimeter. Also, there is substantial nonuniformity of the composite product where the individual units were not all formed simultaneously.

When microminiature semiconductor elements are to be formed closely adjacent each other on a semiconductor wafer and the wafer is subsequently thinned by mechanical means, such as lapping or grinding, stresses in the wafer as its thickness approaches a few microns frequently can cause cracking along undesired regions of the wafer extending, for example, through active elements thereby ruining an entire group having many good elements when all of the elements of the group are subsequently formed into a single hydrid integrated circuit unit.

SUMMARY OF THE INVENTION

In accordance with this invention, large numbers of individual semiconductor elements formed from the same semiconductor substrate and/or epitaxial layer are transferred automatically during processing to a final circuit structure which is preferably highly thermally conductive and which may be either electrically insulating or electrically conductive thereby substantially reducing the fabrication cost as well as increasing the percentage of acceptable units. The smaller the area from which the total elements of a given integrated circuit chip are formed, the less the probability that such an area in a wafer contains a defect in the original layer which would render the final unit unacceptable. Therefore, the more elements which can be produced in any given area of a semiconductor layer, the higher the percentage yield of good units per wafer is. It is, therefore, necessary to use production processes which eliminate the necessity of selection and assembly of individual elements into integrated circuits on substrates other than the semiconductor material from which the individual elements were formed.

More specifically, in accordance with this invention, semiconductor elements are formed in a wafer of semiconductor material, such as gallium arsenide or silicon, by forming an epitaxial layer of semiconductor material and forming pedestals containing active and/or passive semiconductor elements, which may include Schottky barrier devices in said layer. In accordance with this invention, the elements may be partially or completely formed prior to or after the separation of the various portions of the epitaxial layer into individual regions. Portions of the epitaxial layer are removed surrounding each of the regions to form the pedestals, said portions preferably having elongated regions where additional material is removed to form grooves which extend around the pedestal regions and which extend into the substrate for a distance somewhat greater than the eventual thickness of the epitaxial layer. Such grooves may be of any desired shape and cross-sectional dimension and, if desired, may be achieved by preferential etching using specific crystal orientation, in accordance with the teaching of U.S. Pat. No. 3,486,892 issued Dec. 30, 1969 to W. C. Rosvold and assigned to the same assignee as this invention. The regions are removed in accordance with well-known techniques, for example, by etching through masks formed on the surface of the layers by photoresist techniques. Such grooves may be used with or without other depressions formed in the semiconductor substrate to relieve stresses which may occur during subsequent mechanical fabrication operations and/or used as a monitor during subsequent removal of portions of the substrate from the opposite side of the wafer from the epitaxial layers.

In accordance with this invention, a mechanical handle in the form of an easily removable metal layer is deposited over a removable protective coating, such as silicon dioxide, and deposited on the surface containing the pedestals. The handle may be, for example, gold, plated over said protective layer to a thickness of 100 to 300 microns, the base for said plating having first been formed, for example, by a coating of gold deposited by evaporation. It should be clearly understood that any desired handle layer material could be used, such as rapidly grown epitaxial polycrystalline silicon or any desired potting compound which is sufficiently resilient that it will not crack during subsequent processing of the wafer. The opposite side of the wafer is then lapped, ground, etched or otherwise processed to remove the semiconductor material until at least the bottoms of the grooves are exposed thereby separating the wafer into individual semiconductor regions. While it is contemplated that portions of the wafer interconnecting individual regions in a variety of paths is within the scope of this invention, it is preferred that the individual elements be completely separated from each other.

In accordance with this invention, electrical contact is made to the exposed regions of the semiconductor material beneath the active elements by depositing a conductive layer on the remaining substrate surfaces. Any desired metal, alloy or multilayer conductor system can be used and Schottky barriers can be formed. Preferably, the layer forms ohmic contacts with the semiconductor. For example, if the semiconductor is heavily N-doped gallium arsenide, a layer of platinum is deposited, for example, by evaporation and a support substrate is attached to the metal conductive layer by means of a metal solder layer which is thermally conductive and has a plasticity which deforms under a stress below the tensile stress unit of the semiconductor material. For power devices such as avalanche diodes, the support is preferably highly conductive, both thermally and electrically, and may be, for example, a layer of gold or copper, and the distance from this thermally conductive support which serves as a heat sink to the semiconductor regions which produce the maximum amount of heat during operation is made as short as practicable and, preferably, less than a few microns.

In an alternative embodiment of the invention, different kinds of semiconductor elements, such as oscillators, mixers, amplifiers and switches, may be all supported on the same support and for this purpose, preferably an electrically insulating thermally conductive support such as beryllium oxide is connected, for example by soldering, to the conductive layer deposited on the exposed semiconductor substrate regions.

The regions of the epitaxial layer surrounding the semiconductor elements need not be completely removed prior to the substrate removal but, preferably, at least the stress relieving grooves should be formed to avoid cracking through the desired semiconductor regions during the mechanical lapping process, and such grooves or elevation features can be used for mask alignment from subsequent process steps.

In accordance with this invention, the structure so formed may be further processed in accordance with any desired procedures to form diodes, transistors, integrated circuit connections and interelement isolation and, indeed, the spaces between the elements may, if desired, be refilled with insulating material, such as polycrystalline semiconductor, or which interconnecting leads may be supported. In addition, it is contemplated that all of the interconnections may be supported directly on the support and such interconnections may be formed prior to positioning of the mechanical handle of the semiconductor areas so that masking operations can process a complete wafer at one time. Also, interconnections may be formed over one or more insulating layers covering the removed substrate regions and/or filling the stress relieving grooves so that substantially the only electrical connections which need be made to the integrated circuit units are those connecting to external units.

In accordance with this invention, the processes for isolating the individual semiconductor active elements from each other, for mounting such elements on a thermal heat sink, and for forming electrical connections and interconnections to and between said elements are all low temperature processes. More specifically, the semiconductor material remains below its softening temperature which is defined as the temperature below which no substantial movement of the P or N type impurities occurs in the semiconductor elements. As a result, close tolerances of microminiature semiconductor elements can be maintained and densely packed hybrid integrated circuits can be achieved.

BRIEF DESCRIPTION OF THE DRAWINGS

Other and further objects and advantages of the invention will become apparent as the description thereof progresses, reference being had to the accompanying drawings wherein:

FIG. 1 illustrates a sectional view of a wafer or semiconductor material having stress relieving grooves formed therein;

FIG. 2 illustrates the structure of FIG. 1 with active semiconductor elements formed in an epitaxial layer of the wafer and a mechanical handle attached to said elements;

DESCRIPTION OF THE PREFERRED METHOD

Figure 3:
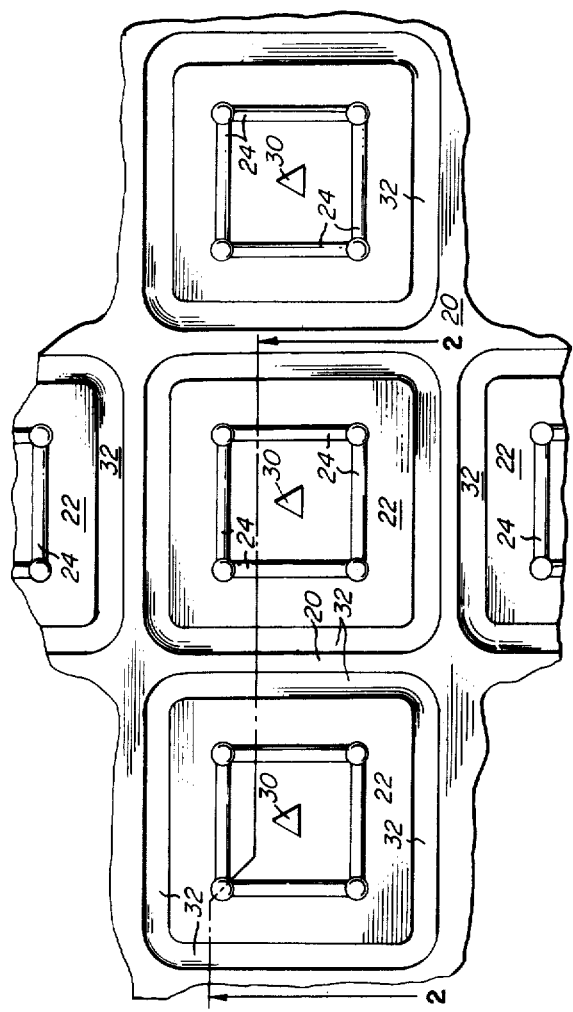
FIG. 3 illustrates a top plan view of the structure of FIG. 2 prior to deposition of the mechanical handle and illustrating an example of elongated active semiconductor elements in the form of hollow squares.

Referring now to FIG. 1, there is shown semiconductor body 10 which may be of any desired type, for example, a portion of a wafer of gallium arsenide heavily doped with sulfur, for example, to a concentration on the order of $2 \times 10^{18}$ carriers per cubic centimeter and designated $N^{++}$. Body 10 may have a thickness of, for example, 200 to 400 microns.

Deposited on body 10 is an epitaxial layer 12 of gallium arsenide lightly doped with N type impurity, for example, to a carrier density of $10^{16}$ carriers per cubic centimeter and designated $N^-$. While layer 12 is preferably less than ten microns thick and, as shown here, is three to four microns thick, any desired thickness and inpurity concentration can be used.

Diffused into the surface of epitaxial layer 12 is a $P^+$ layer 14 which may be, for example, 0.5 to one micron thick and may have, for example, a carrier concentration produced by a zinc impurity of $10^{19}$ carriers per cubic centimeter. Layers 12 and 14 are formed by epitaxial growth and diffusion at elevated temperatures in accordance with well-known practice and retain crystal orientation similar to the substrate 10.

A photoresist layer 16 is then deposited on the diffused layer 12 and windows 18 are opened in the photoresist layer by exposing the photoresist layer through a mask, developing the photoresist, and removing the photoresist material in the region of the windows. The surface of the wafer is then subjected to a chemical etch to form grooves whose bottoms 20 extend into the substrate 10 to any desired depth, dependent of the etching time. For example, as illustrated herein, a depth of five to eight microns is desired and since the semiconductor is gallium arsenide, an etch of two parts sulfuric acid, two parts hydrogen peroxide and six parts water will etch the gallium arsenide at a rate of approximately one-fifth of a micron per second at 40° C. It should be noted that since this process step is carried out substantially at room temperature, no further diffusion of the layer 16 or the layer 12 will occur from this process step and, hence, the geometric dimensions of the finished product may be accurately maintained.

Referring now to FIG. 2, there is shown the wafer portion 10 of FIG. 1 in which the photoresist layer 16 has been stripped off and portions of the epitaxial layers 12 and 14 together with portions of the substrate 10 have been removed to bottoms 22 leaving isolated epitaxial pedestal regions 24 formed by etching through windows in the mask by the same etch solution used to produce the grooves 20. It should be clearly understood that, if desired, the removal of both the materials for grooves 20 and portions between the pedestal could be achieved with one mask and etch operation but, preferably, two such steps are used in order to optimize the shape of the pedestal bases supporting the remaining epitaxial regions 24.

A protective layer of material, such as silicon dioxide 26, one-half micron or so thick is preferably sputter deposited over the entire surface of the wafer to protect the epitaxial junction regions during subsequent processing, and a thick material 28 is deposited over this region for support of the structure during subsequent processing, hereinafter referred to as a processing handle or handle, is deposited over the protective layer 26. Layers 26 and 28 are formed by processes which avoid any substantial movement of the layers 12 and 14 by diffusion. For example, layer 28 may be formed by evaporating a surface coating of chromium or gold onto the surface of protective layer 26 to form good adhesion to the silicon dioxide 26 and an electrical plating contact. Layer 28 may be formed by plating a layer of gold several mils thick on the adhesive layer of chromium-gold alloy to form a handle for further processing of the wafer. It should be clearly understood that any desired material could be used for layer 28 and that high temperature processes, such as epitaxial growth of polycrystalline silicon, could be used. However, since such a layer is to be subsequently removed, it is preferably of a material which can be removed, for example, by etching with an etch which will not substantially etch the protective layer 26. In addition, layer 28 should be sufficiently non-brittle that it will not crack when the wafer is subject to additional processing. Since gold is sufficiently malleable that it does not crack and is easily applied by plating, it has been found useful for this purpose.

FIG. 3 illustrates a top plan view of the structure as shown in FIG. 2 prior to deposition of the protective layer 26 and the handle 28. As shown herein, the groove bottoms 20 are interconnected in the form of a grid of squares, and the regions removed between pedestals 24 are removed to bottoms 22 exposing the substrate portion 10. The individual pedestals 24 are, as shown herein, formed of elongated regions making squares to optimize heat dissipation in the final structure. Additional isolated triangular pedestal regions 30 (omitted from FIGS. 1 and 2 for clarity) are provided which are preferably used for mask alignment steps to insure that the mask is aligned within a fraction of a micron over the entire face of the wafer which produces several hundred units, each of which may have a substantial number of squares of the elevated regions 24 formed thereon.

As illustrated herein, the grooves 20 have sloping walls 32. However, any desired wall shape may be used.

Figure 4:
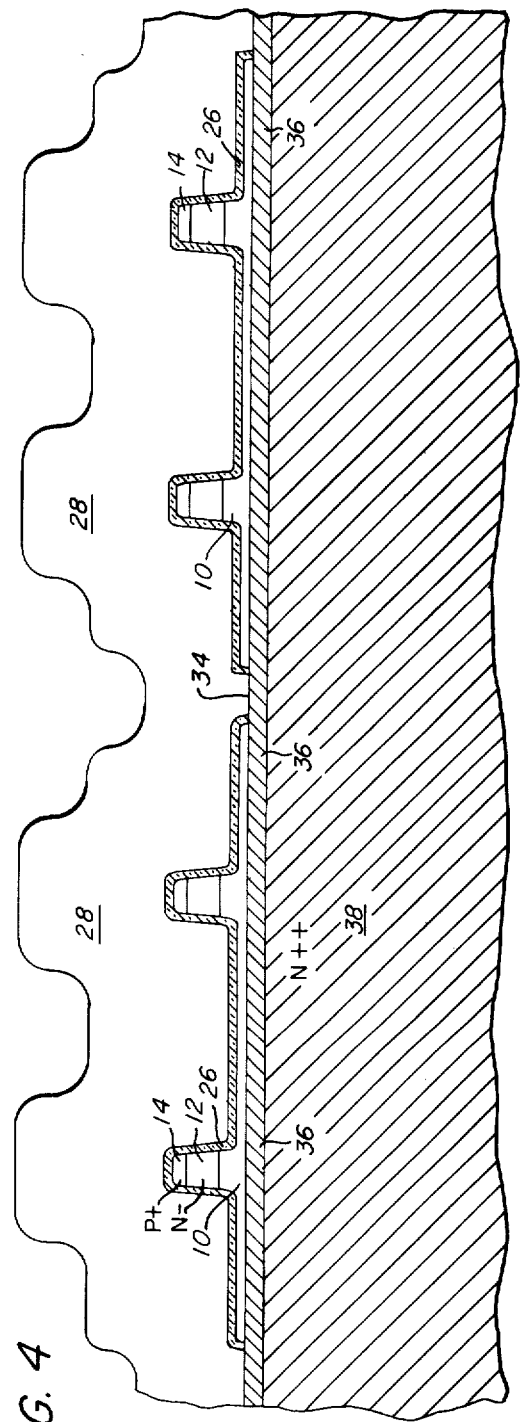
FIG. 4 illustrates the structure of FIG. 2, with the active semiconductor elements separated from each other and mounted on a heat sink.

Referring now to FIG. 4, the portion of substrate 10 on the opposite side of the wafer from the gold handle 28 has been removed, in accordance with well-known practice, by lapping. In such a process, a grinding compound is rubbed against the surface by a disc and a weight is uniformly applied across the entire surface of the wafer so that all portions thereof are uniformly lapped. Such lapping, preferably, is performed in several steps with optical inspection of the lapped surface to determine whether the wafer is being lapped uniformly and/or whether the wafer was of non-uniform thickness so that by adjusting the weight applied to different portions of the wafer, the surface may be lapped exactly parallel to the original surface containing the epitaxial layers. Lapping continues until the bottoms of the groove 20 are opened and the gold handle 28 in these regions is exposed as shown, for example, at 34.

When the devices are to be used as powder devices such as avalanche diodes operating, for example, in the IMPATT or TRAPATT modes, preferably the regions 10 of the original substrate are preferably, as shown, a few microns thick, extending outwardly at the bases of the mesas 24 to assist in distributing the current density and heat density patterns and to avoid sharp discontinuities in the semiconductor material close to the region of the junction between the layers 14 and 12 and the layers 12 and 10. When other devices, such as the transistors performing different functions, are formed on the same integrated circuit, lapping may continue to remove most of the substrate 10 extending outwardly from the base of the mesas 24.

The lapped surface is further processed in any desired manner, for example by etching, to thoroughly clean the substrate area 10 and the semiconductor regions 24 including layers 10, 12 and 14 which may now have an aggregate thickness on the order of ten microns are coated with a conductive layer 36 comprising, for example, platinum by any desired process, such as vacuum evaporation deposition or sputter deposition in accordance with well-known practice. Layer 38 is then electrolytically plated on layer 36 to the desired thickness in accordance with well-known practice.

Preferably, layer 38 is of thermally and/or electrically conductive material such as gold. However, if desired, layer 38 may be a block of low dielectric high thermal conductivity insulating material such as beryllium oxide or insulating material having any other desired characteristics which has had a surface coated with a bonding agent and bonded to the metal layer 36, for example, by heating to a temperature where bonding occurs. substrate 10 to act as a collector so that substrate 10 and/or epitaxial layer 12 will act as the base and diffused layer 14 will act as the emitter, thus forming a transistor. In this event, separate electrical connections are made to the base regions 12 in any desired manner in accordance with well-known practice.

Figure 5:
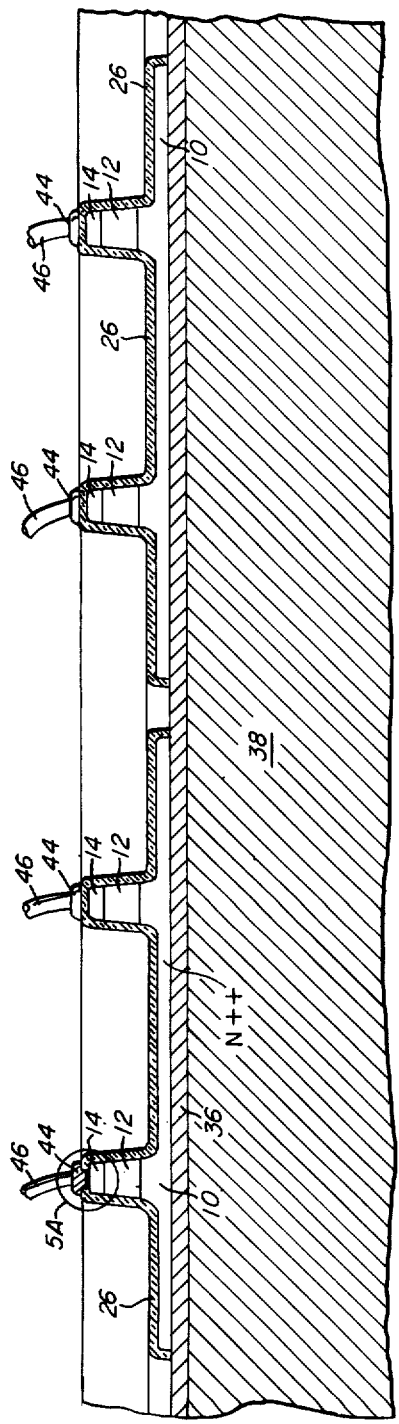
FIG. 5 illustrates a completed structure with electrical contacts to the active semiconductor elements.
Figure 5A:
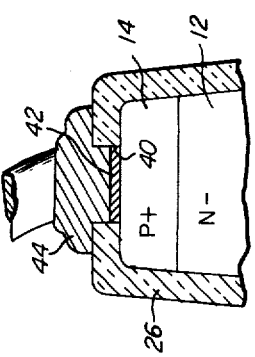
FIG. 5A is an expanded view illustrating details of the contact structure of FIG. 5.

Referring now to FIG. 5, the individual semiconductor devices 24 are supported on the conductive heat sink 38 and the handle 28 has been removed by subjecting the side of the wafer structure having the handle 24 to an etch such as aqua regia which removes the gold but stops at the platinum metal layer 36, the heat sink 38 being protected during this process by any desired well-known means such as by a coating of plastic.

The silicon dioxide layer 26 may, if desired, be removed and redeposited, in accordance with well-known practice, as a clean layer of material, or the original layer 26 may be retained as shown. Windows 40 are opened through layer 26 at the tops of the mesas 24 by means of a photoresist mask, and conductive contacts 42 to layer 14 are formed therein, for example, by vapor or sputter depositing a thin layer of any desired metal, such as platinum, which forms an ohmic contact with P+ diffused layer 14. A thick conductive layer 44 of metal such as gold may be then plated on metal layer 42 and a lead 46, for example of a gold alloy, may the thermal compression bonded to select points along the mesa region so that a bias voltage may be impressed between conductive substrate 38 and lead 46 to back bias the junction between layers 12 and 14 sufficiently to produce microwave oscillations in any desired frequency range up to tens of thousands of megahertz.

By attaching support 38 to a heat sink, such as a cooled plate (not shown), large amounts of microwave power may be generated, with the heat flowing primarily out through the heat sink 38.

Figure 6:
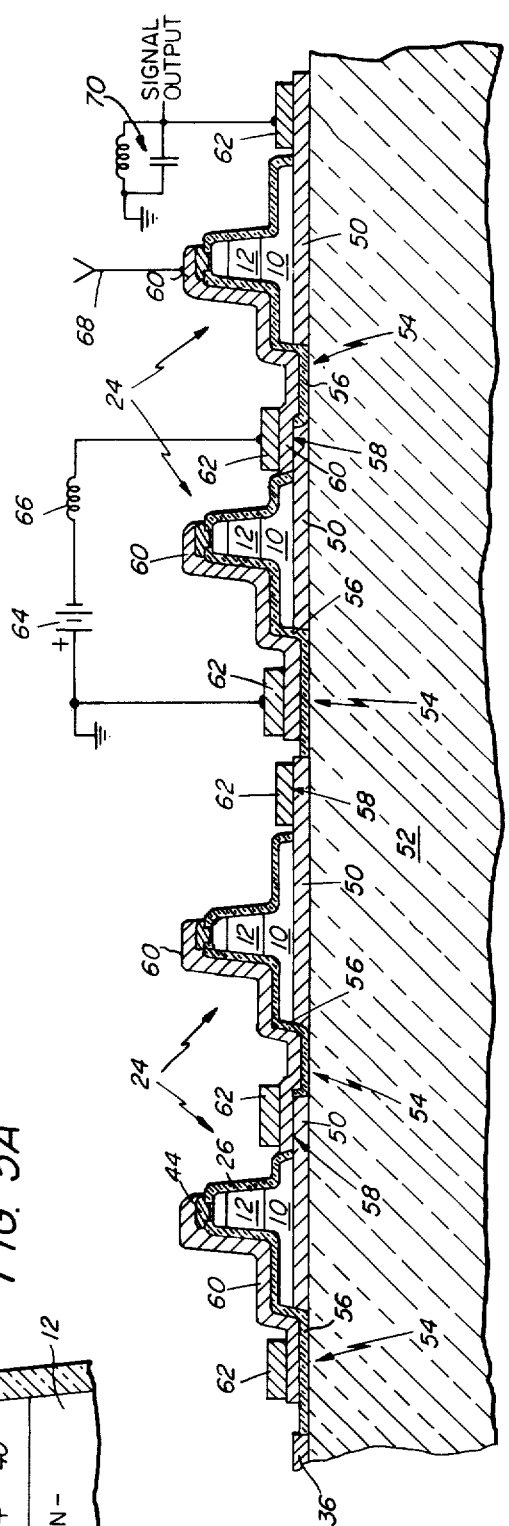
FIG. 6 illustrates an alternate embodiment of the invention utilizing an insulating heat sink for isolating adjacent semiconductor elements.

Referring now to FIG. 6, there is shown a structure formed in accordance with the process steps described above through FIG. 2. However, the lapping process described in FIG. 4 has been continued to reduce the height of the semiconductor regions, for example, to five to eight microns in thickness. Since the lapping had continued until a few microns more of the substrate 10 were removed, the region of extension of the substrate 10 beyond the mesa pedestal regions 24 is reduced.

A bonding layer of metal 50 comprising, for example, a layer of a low melting point alloy 5 such as 88% gold and 12% germanium one-half micron thick is sputter deposited on the exposed substrate regions 10.

An insulating substrate 52, such as for example beryllium oxide, having a surface thereof coated with metal such as gold by evaporation or sputtering, is bonded to the coated surface of substrate 15 by being placed in contact therewith and being heated, for example, to 325° C to firmly bond the layer 50 to the insulating substrate 52.

The gold handle 20 is then removed by the process previously described, leaving the protective regions 26 of silicon dioxide. Portions of the metal layer 50 are then removed by mask etching to expose the insulator 52, as shown for example at 54, thereby electrically isolating adjacent devices 24.

An additional protective layer 56 of, for example, silicon dioxide, is overlaid over layer 26 or, alternatively, the layer 26 may be removed in accordance with well-known practice and a new layer 56 redeposited over the entire surface. Windows are then opened by photoresist mask etching through layer 56 to contact portions of the conductive layer 50, for example as shown at 58, and the tops of the pedestals 24 and contacts 42 and 44 are formed. Metal interconnections are then made, as shown at 60, connecting the metal contact 42 of one element with the metal layer 50 contacting an adjacent element so that the diodes illustrated are connected in series. Interconnectors 60 may be made by thermal compression bonding of leads 46 in the regions 62 between the elements 24 to avoid any danger of damaging the elements 24 or, if desired, the contacts may be made to the edges of the units containing many of the elements 24 and the leads 60 thickened by plating as at 62 to carry sufficient current for actuation of the units.

By this invention, any number of individual avalanche diodes may be connected in series thereby adapting the units to any desired applied input voltage level. In addition, elements may be connected in parallel by groups, and the groups connected in a series so that any desired level of power may be generated for any desired power supply voltage. If desired, one of the mesas may be operated as an oscillator by applying a voltage of several volts by battery 64 across the diode through a choke 66 through pads 62 as shown and the adjacent diode may be operated as a mixer to obtain an IF frequency across tank 70 from a signal received from an antenna 68.

Alternatively, the structure of FIG. 5 may be used to form a microwave transistor in which an electrically insulating thermally conductive body has a plurality of mesa regions bonded thereto by a conductive layer which makes ohmic contact with N type semiconductor regions (preferably of N type material) formed as an epitaxial layer or an original substrate which was removed by lapping, and a P layer diffused into the epitaxial layer to form base regions of P type material and an N+ layer diffused into the P layer to form emitter regions. The semiconductor material may be of any desired type, such as silicon or gallium arsenide, and the impurity concentrations of the various regions as well as the impurity materials may be selected in accordance with well-known practice. A layer of protective insulating material preferably covers the exposed semiconductor surfaces with emitter windows, base connection windows and collector connection windows formed with conventional photoresist mask techniques. Emitter contacts connections, base connections and collector connections are formed in the windows by any desired metallization method including evaporation, sputtering and/or plating in any desired sequence to form, for example, an interdigital transistor structure. If desired, the emitter regions may be formed by diffusion through apertures in the windows such that the base metal leads are in the same planar level as the emitter contacts. Such structures may have any desired configuration of shapes, such as squares, diamonds, circles or other shapes, which maximize the base periphery to enhance amplification at microwave frequencies.

This completes the description of the embodiments of the invention illustrated herein. However, many modifications thereof will be apparent to persons skilled in the art without departing from the spirit and scope of this invention. For example, any desired circuit may be formed in accordance with this invention and additional high temperature steps may be used for formation of junctions at any point in the process. In addition, while the shape of the pedestals is shown in the form of squares or circular mesas, any other desired configuration can be used which preferably has a width transverse to the direction of the motion of the carriers and the semiconductor material which is less than ten times the thickness of the active region of the semiconductor region elements. Accordingly, it is contemplated that this invention be not limited by the particular embodiments described herein except as described in the appended claims.

I claim:
1. In combination:
   a support substrate having a predetermined thermal coefficient of expansion;

a plurality of separate semiconductor elements comprising semiconductor material, said semiconductor material having a different thermal coefficient of expansion from said substrate; and a thermally conductive layer, a first surface of said thermally conductive layer being bonded to said semiconductor material of said semiconductor elements and a second surface of said thermally conductive layer being bonded to said substrate, said thermally conductive layer being continuous between said semiconductor material of said semiconductor elements and said substrate, and said thermally conductive layer having a plasticity which deforms under a stress below the tensile stress limit of said semiconductor material.

2. The combination in accordance with claim 1 wherein said elements are formed from the same body of semiconductor material and said layer comprises a conductive metal.

3. The combination in accordance with claim 2 wherein said substrate comprises an electrically conductive metal.

4. The combination in accordance with claim 2 wherein said substrate comprises an electrical insulator.

5. The combination in accordance with claim 4 wherein said layer provides electrical contacts to electrodes of said elements.

6. The combination in accordance with claim 5 wherein said semiconductor elements comprise gallium arsenide.

7. The combination in accordance with claim 1 wherein said elements comprise IMPATT diodes.

8. The combination in accordance with claim 5 wherein said semiconductor elements comprise series connected unidirectional conducting elements.

9. The combination in accordance with claim 8 wherein said elements have electrodes on the opposite side thereof from said metal layer.

10. In combination:
a support substrate having a predetermined thermal coefficient of expansion;
a plurality of separate semiconductor elements comprising semiconductor material, said semiconductor material having a different thermal coefficient of expansion from said substrate; and
a thermally conductive layer, a first surface of said thermally conductive layer being bonded to said semiconductor material of said semiconductor elements and a second surface of said thermally conductive layer being bonded to said substrate, said thermally conductive layer being continuous between said semiconductor material of said semiconductor elements and said substrate, and said thermally conductive layer having a plasticity which deforms under a stress below the tensile stress limit of said semiconductor material.

11. The combination in accordance with claim 10 wherein said substrate comprises an electrical insulator.

12. The combination in accordance with claim 11 wherein said layer provides electrical contacts to electrodes of said elements.

* * * * *